United States Patent [19]
Hazen et al.

[11] Patent Number: 5,742,935
[45] Date of Patent: Apr. 21, 1998

[54] METHOD AND APPARATUS FOR CONTROLLING THE PROTECTION MODE OF FLASH MEMORY

[75] Inventors: Peter K. Hazen, Auburn, Calif.; Michael J. Castillo, Provo, Utah

[73] Assignee: Intel Corporation, Santa Clara, Calif.

[21] Appl. No.: 581,049

[22] Filed: Dec. 29, 1995

[51] Int. Cl.⁶ ..................................................... G06F 12/14
[52] U.S. Cl. ..................... 711/152; 711/163; 711/186; 711/103
[58] Field of Search .................... 395/163, 186; 326/59, 60; 711/609, 103, 726, 800.05, 800.06, 152

[56] References Cited

U.S. PATENT DOCUMENTS

| | | | |
|---|---|---|---|
| 3,949,242 | 4/1976 | Hirasawa et al. | 326/60 |
| 4,518,875 | 5/1985 | Aytac | 326/59 |
| 5,432,950 | 7/1995 | Sibigtroth | 395/163 |

OTHER PUBLICATIONS

Intel Flash Memory Databook, pp. 3-1 through 3-48 (Oct. 1993).

Intel Flash Memory Databook, pp. 4-1 through 4-12 (Dec. 1994).

*Primary Examiner*—Tod R. Swann
*Assistant Examiner*—J. Peikari
*Attorney, Agent, or Firm*—Blakely, Sokoloff, Taylor & Zafman

[57] ABSTRACT

A method and apparatus for protecting data stored in a nonvolatile memory. First, a system to which an interface is coupled asserts a first signal that is one of two voltages. In addition, the system to which the interface is coupled asserts a second signal that is one of two voltages. The interface comprises circuitry that translates these two signals into a third signal that is one of three voltages. This third signal is then passed to and used by the nonvolatile memory to place the memory into one of three different protection modes.

15 Claims, 2 Drawing Sheets

| WRITE PROTECTION PROVIDED | OPERATING MODE | RP# | WP# |
|---|---|---|---|
| RESET/ LOCK ALL BLOCKS | RESET/ DEEP POWER-DOWN | $V_{IL}$ | DON'T CARE |
| UNLOCK ALL BLOCKS | STANDARD OPERATION | $V_{HH}$ | DON'T CARE |
| LOCK BOOT BLOCK | STANDARD OPERATION | $V_{IH}$ | $V_{IL}$ |
| UNLOCK ALL BLOCKS | STANDARD OPERATION | $V_{IH}$ | $V_{IH}$ |

METHOD AND APPARATUS FOR CONTROLLING THE PROTECTION MODE OF FLASH MEMORY

FIELD OF THE INVENTION

The present invention relates to integrated circuit memories and more particularly to a method and circuit for preventing the loss of data stored in a nonvolatile memory by locking the memory.

BACKGROUND OF THE INVENTION

Nonvolatile memory is used by electronic equipment to store data. Data stored within nonvolatile memory is retained even when power to the electronic equipment is cut off. Therefore, nonvolatile memories are typically used in applications in which the user requires that data survive power interruptions to the electronic equipment or power interruptions to the memory itself, such as during physical transfer of a memory device from one piece of computer equipment to another. For example, it has been found useful to store data necessary to boot up a computer system in nonvolatile memory inside the computer so that the data is available to the computer each time a user turns it on. As another example, a standard memory card contains nonvolatile memory that allows a user to store data on the memory card at a first computer and then access the data using a second computer into which the memory card is subsequently inserted.

There are many types of nonvolatile memory storage devices, the most popular of which is the electrically programmable read only memory (EPROM). One type of nonvolatile memory is the electrically programmable and electrically erasable read only memory (EEPROM) that was developed to erase and to rewrite the data contained in the memory on a byte-by-byte basis. More recently, a new category of nonvolatile memories has emerged known as flash EEPROMs. In a flash memory, an entire array of data, called a block of data, is simultaneously erased. While a flash memory is capable of storing relatively large amounts of data in comparison to other nonvolatile memories, flash also exhibits many disadvantages as well.

For example, flash memories have been found to be vulnerable to inadvertent write and erase operations. During a write operation, a flash memory is programmed by storing the desired data in the device. The flash memory is erased in blocks. Once data has been stored in a flash memory by a series of write operations, the data may be read from the flash memory any number of times without incident. Software bugs or computer glitches have been known to inadvertently corrupt data contained within a flash memory, however, by accidentally causing computer data to be written over or erased. In addition, when a computer system to which a flash memory is coupled is turned on, off, or is reset, the supply voltage to the memory fluctuates. A flash memory may be inadvertently placed in a write or erase mode, particularly during power-up or power-down, when system control signals are indeterminate due to supply voltage fluctuations, making the flash device susceptible to data corruption.

To protect the data stored within a nonvolatile memory from these and other modes of corruption, protection circuitry is designed into the memory device. This protection circuitry, shuts off or "locks out" access to the memory during periods of vulnerability. For example, one type of protection circuit is coupled to a reset/deep power-down ("RP#") control pin of the memory such that when a particular voltage generated by the computer system is registered by this pin, the protection circuit inside the memory places one or more blocks of memory into lockout mode, preventing all write and erase operations to these memory blocks. By preventing all write and erase operations during lockout, inadvertent write and erase operations, which would corrupt the integrity of the data, are avoided.

In addition, the RP# signal holds the write state machine in reset, which defaults the memory to the read mode. This prevents the write state machine from inadvertently entering a mode other than the read mode due to indeterminate control signals caused by supply voltage fluctuations during power-up. Immediately following the system voltage power-up, the memory must be ready in read mode so that the system CPU can fetch the information necessary to initialize (or "boot") the system. If the memory is inadvertently put into another mode, such as, for example, the status register mode, the system CPU will not be able to fetch the necessary information for system initialization, and the system will not boot correctly (i.e. the system will "hang").

Many memories acknowledge three different RP# voltage levels, placing the memory into one of three different protection modes depending on the RP# voltage level. To avoid the necessity of supporting three different voltage levels in a computer system, rather than the standard two voltage levels of $V_{cc}$ and ground, a second control pin, write protect ("WP#"), is added to more recent memories. Using both the RP# and WP# control pins, a memory can respond to strictly binary (one of two) voltage levels applied to these pins to select among the three different protection modes. Unfortunately, computer systems designed to support more recent memories containing the WP# pin are incompatible with other memories that do not contain the pin.

SUMMARY AND OBJECTS OF THE INVENTION

An object of the invention is to provide a method for controlling the protection mode of a memory comprising a control pin that responds to more than two voltage levels.

Another object of the invention is to provide compatibility between memories which do not contain a WP# pin and computer systems designed to support memories which do contain the pin.

A method and apparatus is described for protecting data stored in a nonvolatile memory. First, a system to which an interface is coupled asserts a first signal that is one of two voltages. In addition, the system to which the interface is coupled asserts a second signal that is one of two voltages. The interface comprises circuitry that translates these two signals into a third signal that is one of three voltages. This third signal is then passed to and used by the nonvolatile memory to place the memory into one of three different protection modes.

Other features and advantages of the present invention will be apparent from the accompanying drawings and the detailed description that follows.

BRIEF DESCRIPTION OF THE DRAWINGS

The present invention is illustrated by way of example and not limitation in the figures of the accompanying drawings in which like references indicate similar elements and in which.

DETAILED DESCRIPTION

A method and apparatus for controlling the protection mode of a memory is described in which a switching circuit is used to couple the memory to the system. The switching circuit translates binary voltage levels from the system into a three level voltage signal for use by the RP# pin of the memory, which is typically a flash memory. The switching circuit accepts two inputs, a reset and an unlock signal, and generates two outputs, RP# and WP#. The WP# output is optional and is primarily for use with memories that support this pin. For memories that do not support WP#, the RP# output of the switching circuit is coupled to the RP# control pin of the memory, thereby providing system control over the protection mode of the memory.

The switching circuit uses a $V_{pp}$ power supply, and, under the proper conditions, the voltage from this power supply is transferred to the RP# output of the circuit. Various protection modes and a switching circuit in accordance with an embodiment of the present invention are described in more detail below.

Figures 1, 2:
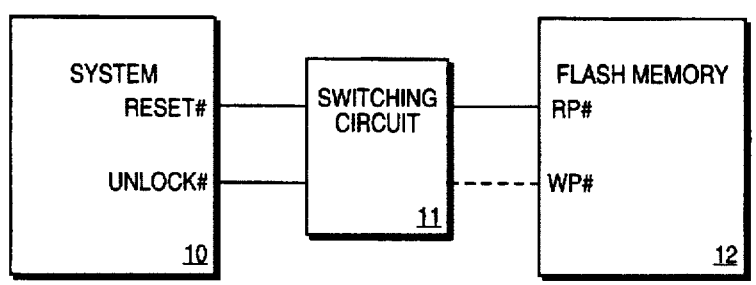
FIG. 1 is a chart that indicates the protection and operating modes of a memory having the associated voltages applied to its control pins in accordance with an embodiment of the present invention.
FIG. 2 is a block diagram of a flash memory coupled to a system through a switching circuit in accordance with an embodiment of the present invention.

FIG. 1 is a chart that indicates the protection and operating modes of a memory having the associated voltages applied to its RP# and WP# (if one exists) control pins in accordance with an embodiment of the present invention. Note that RP# controls three different functions, each associated with one of three different voltage levels. When RP# is approximately equal to a first voltage $V_{IL}$, the memory is in a reset and deep power-down mode. In this mode, the device's output is in a high impedance state, the write state machine is reset, and the device draws minimum current. Furthermore, all write and erase commands are ignored, providing another means of data protection during power-up and power-down. As indicated in the chart, the protection mode of the memory when RP# is approximately equal to $V_{IL}$ is highest because all blocks of the memory are protected from corruption by being locked. In addition, the value of WP# is inconsequential in this mode of operation. For one embodiment, the voltage $V_{IL}$ is a logical low voltage level such as, for example, ground.

When RP# is approximately equal to a second voltage $V_{HH}$, the memory is in a standard operation mode. In this mode and at this RP# voltage level, the protection mode offers very little protection because all of the blocks are unlocked, exposing the entire contents of the memory to potential corruption. Any block within the memory may be written to or erased. In addition, the value of WP# is inconsequential in this mode of operation. For one embodiment, the voltage $V_{HH}$ is higher than the conventional logical high voltage level $V_{cc}$ (or $V_{IH}$, as described below) such as, for example, a programming voltage $V_{pp}$ of 12V.

When RP# is approximately equal to a third voltage $V_{IH}$, the memory is again in a standard operation mode. In this mode and at this RP# voltage level, the protection mode offered by the device depends on the value of WP#. If WP# is approximately equal to $V_{IL}$, then the protection mode offered by the device is to lock the boot block while leaving the other blocks unlocked. The boot block is a predetermined block of memory in a memory that is designed to contain information required by a computer system upon booting up the system. A computer system cannot boot up without this information, so because of the importance of this information, a more highly protected region of memory is dedicated to storing this information. Similarly, other important data that a user desires to better protect from corruption is stored in the boot block.

Therefore, in this mode of protection, write and erase commands to the boot block are ignored, thereby protecting the boot block from corruption. Any other block within the memory may be written to or erased, and all blocks can be read. For memories that have no boot block, the entire memory is made available for writing and erasing during this mode. The voltage $V_{IH}$ is a logical high voltage level such as, for example, $V_{cc}$ which is approximately 5V, 3V, or other system voltage level.

When RP# is approximately equal to or grater than the third voltage $V_{IH}$ while WP# is approximately equal to $V_{IH}$, the memory is in a standard operation mode while the protection mode offers little protection to the memory. All of the blocks, including boot blocks, are unlocked, exposing the entire contents of the memory to potential corruption. Any block within the memory may be written to or erased.

FIG. 2 is a block diagram of flash memory 12 coupled to a system 10 through a switching circuit 11, which is an interface between the device and the system, in accordance with an embodiment of the present invention. System 10, may be, for example, a computer system, including any electronic device, and generates a RESET# signal that is primarily one of two voltage levels and that, when asserted at a low voltage level, indicates that the system is being reset. In response to the RESET# signal being asserted at, for example, approximately 0V or ground, the flash memory locks out all write and erase operations to prevent data corruption associated with reset power fluctuations in the system. Referring to the chart of FIG. 1, this mode of protection may be achieved by placing approximately 0V or ground, $V_{IL}$, on the RP# control pin of flash memory 12. This voltage is applied to the RP# input of the memory through switching circuit 11 as shown in FIG. 2.

System 10 also generates an UNLOCK# signal that may be one of two voltage levels. Note that the RESET# and UNLOCK# signals may be generated by one or more processors or controllers within system 10. While the UNLOCK# signal remains unasserted at a high logical voltage level, any boot block within flash memory 12 is to be locked. Referring again to the chart of FIG. 1, this mode of protection may be achieved by placing a high logical voltage level of, for example, 5V, $V_{IH}$, on the RP# control pin, and approximately 0V or ground, $V_{IL}$, on the WP# control pin of flash memory 12. These voltages are applied to the control pins of the memory through switching circuit 11 as shown in FIG. 2. Alternatively, for an embodiment in which a flash memory does not have a WP# pin, simply placing 5V on the RP# pin of the device sufficiently puts the memory into the desired protection mode.

When the UNLOCK# signal is asserted at a low logical voltage level, all blocks within flash memory 12 are to be unlocked. Referring to the chart of FIG. 1, this mode of protection may be achieved by placing a higher voltage of, for example, 12V, $V_{HH}$, on the RP# control pin. This voltage is applied to the RP# control pin of the memory through switching circuit 11 as shown in FIG. 2. This embodiment may be found useful when the flash memory used in accordance with the present invention does not support WP# control Alternatively, this mode of protection may be achieved by placing at least a high logical voltage level of, for example, 5V, $V_{IH}$, on the RP# control pin, and approximately 0V or ground, $V_{IL}$, on the WP# control pin of the flash memory. These voltages are applied to the control pins of the memory through the switching circuit of FIG. 2.

Therefore, in accordance with the functionality attributed to switching circuit 11 described above, flash memories that either do or do not support WP# may be interchangeably coupled to a system. The switching circuit provides the proper translation between the system signals RESET# and UNLOCK# and the RP# and, if necessary, WP# voltage levels. Note that flash memories that support WP# can be directly coupled to a system by connecting the RESET# signal output directly to the RP# signal input, and the UNLOCK# signal output directly to the WP# signal input. Incorporating the switching circuit between the system and the memory, however, provides greater flexibility to the system designer, allowing the designer to use a greater variety of memories.

Figure 3:
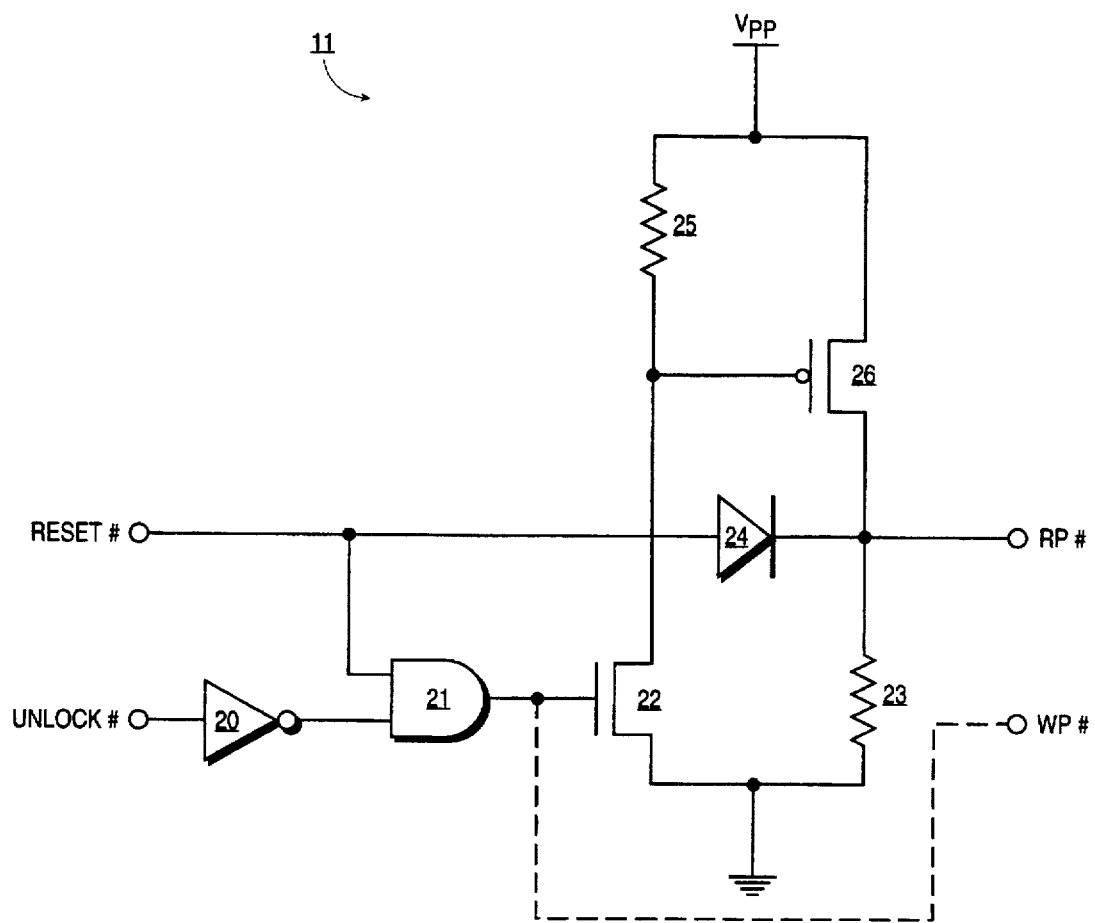
FIG. 3 shows a switching circuit in accordance with an embodiment of the present invention.

FIG. 3 shows the switching circuit 11 of FIG. 2 in accordance with one embodiment of the present invention. The RESET# input signal is coupled to the positive terminal of diode 24 while the negative terminal is coupled to the drain of p-channel transistor 26, one node of 10KΩ resistor 23, and output RP#. The other node of resistor 23 is coupled to ground while the source of transistor 26 is coupled to Vpp, which, for one embodiment, is approximately 12V. The RESET# input signal is also coupled to one of two inputs to AND gate 21.

The UNLOCK# input signal is coupled to the input of inverter 20, the output of which is coupled to one of two inputs to AND gate 21. The output of AND gate 21 is coupled to the gate of n-channel transistor 22 as well as to output WP#. The drain of transistor 22 is coupled to one node of 10KΩ resistor 25 along with the gate of p-channel transistor 26. The other node of resistor 25 is coupled to Vpp. The source of transistor 22 is coupled to ground. In accordance with one embodiment of the present invention, the components of the switching circuit are discrete components coupled together on a printed circuit board within a computer system.

When RESET# input signal is low, which for one embodiment is approximately 0V, the output of AND gate 21 is always low, regardless of the value of UNLOCK#. A low voltage applied to the gate of n-channel transistor 22 turns that transistor off, causing resistor 25 to pull the gate of p-channel transistor 26 up to Vpp, thereby turning it off as well. With transistor 26 turned off, resister 23 pulls the output RP# down to ground. Therefore, regardless of the voltage of UNLOCK#, when RESET# is low, outputs RP# and WP# are both low as well.

When RESET# is high, which for one embodiment is approximately 5V, and UNLOCK# is high, the high voltage of RESET# passes through diode 24 to RP#. Inverter 20 inverts the high UNLOCK# signal, causing the lower input of AND gate 21 to be low, resulting in a low output from AND gate 21 to the gate of n-channel transistor 22 and to WP#. The low voltage applied to the gate of transistor 22 forces the transistor to turn off, thereby allowing resistor 25 to pull the gate of p-channel transistor 26 up to Vpp, turning off transistor 26. The high voltage at the negative terminal of diode 24, caused by the high RESET# signal passing through forward-biased diode 24, is isolated from ground by resistor 23. As a result, when RESET# is high and UNLOCK# is high, RP# is high (RESET# minus the voltage drop through diode 24) and WP# is low.

When RESET# is high and UNLOCK# is low, the high voltage of RESET# is applied to the upper input of AND gate 21. Inverter 20 inverts the low UNLOCK# signal, causing the lower input of AND gate 21 to be high, resulting in a high output from AND gate 21 to the gate of n-channel transistor 22 and to WP#. The high voltage applied to the gate of transistor 22 will turn the transistor on, thereby pulling the gate of p-channel transistor 26 down to ground, turning it on as well. P-channel transistor 26 then pulls RP# up to $V_{pp}$ while negatively biased diode 24 and resistor 23 serve to isolate this high voltage RP# output from the RESET# input node and ground, respectively. As a result, when RESET# is high and UNLOCK# is low, RP# is high (higher than conventional logical voltage levels because RP# is pulled up to the 12V $V_{pp}$ voltage source) and WP# is high.

In the foregoing specification, the invention has been described with reference to specific exemplary embodiments thereof. It will, however, be evident that various modifications and changes may be made thereto without departing from the broader spirit and scope of the invention. The specification and drawings are, accordingly, to be regarded in an illustrative rather than a restrictive sense.

What is claimed is:

1. A switching circuit (1) for receiving (A) a resetting signal having two logic levels and (B) an unlocking signal having two logic levels and (2) for converting the resetting and unlocking signals to an output signal having first, second, and third logic levels for application to a memory in connection with a write protection scheme, wherein the first logic level of the output signal is for locking all blocks of the memory, wherein the second logic level of output signal is for locking a particular block of the memory, and wherein the third logic level of output signal is for unlocking all blocks of the memory.

2. The switching circuit of claim 1, wherein the output signal is a signal for resetting and power down for the memory.

3. The switching circuit of claim 1, wherein the first logic level of the output signal is approximately ground, wherein the second logic level of the output signal is approximately Vcc, and wherein the third logic level of the output signal is approximately Vpp.

4. The switching circuit of claim 3, wherein Vcc is approximately 5 volts and Vpp is approximately 12 volts.

5. The switching circuit of claim 1, wherein the resetting and unlocking signals are received from a computer processor and wherein the memory is flash memory.

6. The switching circuit of claim 1, wherein the resetting and unlocking signals are received from a controller and wherein the memory is flash memory.

7. The switching circuit of claim 1, wherein the particular block of the memory is a boot block.

8. The switching circuit of claim 1, wherein the switching circuit is comprised of:
   (1) a diode coupled between the resetting signal and the output signal;
   (2) a first resistor having a first node coupled to Vpp;
   (3) a first transistor having a drain coupled to a second node of the first resistor and a source coupled to ground;
   (4) a logic gate having:
      (a) a first input coupled to the resetting signal;
      (b) a second input coupled to the unlocking signal;
      (c) an output coupled to a gate of the first transistor;
   (5) a second resistor having a first node coupled to the diode and a second node coupled to ground;
   (6) a second transistor having (a) a gate coupled to the second node of the first resistor and to the drain of the first transistor;
(b) a source coupled to Vpp; and
(c) a drain coupled to the diode and to the first node of the second resistor.

9. A computer system comprising:
(1) a processor for generating a resetting signal having two logic levels and an unlocking signal having two logic levels;
(2) a switching circuit for receiving the resetting signal and the unlocking signal and for converting the resetting and unlocking signals to an output signal having first, second, and third logic levels;
(3) a semiconductor memory for receiving the output signal of the switching circuit in connection with a write protection scheme, wherein the first logic level of the output signal is for locking all blocks of the semiconductor memory, wherein the second logic level of the output signal is for locking a particular block of the semiconductor memory, and wherein the third logic level of the output signal is for unlocking all blocks of the semiconductor memory.

10. A method for protecting data, comprising the steps of:
(1) receiving a resetting signal having two logic levels;
(2) receiving an unlocking signal having two logic levels;
(3) converting the resetting and unlocking signals to a memory signal having first, second, and third logic levels;
(4) applying the memory signal to a memory and
   (a) locking all sections of the memory if the memory signal is at the first logic level;
   (b) locking a particular section of the memory if the memory signal is at the second logic level; and
   (c) unlocking all sections of the memory if the memory signal is at the third logic level.

11. The method of claim 10, wherein the resetting and unlocking signals are received from a processor.

12. The method of claim 11, wherein the resetting and unlocking signals are received from a controller.

13. The method of claim 10, wherein the first logic level of the memory signal also resets the memory.

14. The method of claim 10, wherein the first logic level of the memory signal is approximately ground, wherein the second logic level of the memory signal is approximately Vcc, and wherein the third logic level of the memory signal is approximately Vpp.

15. The method of claim 10, wherein the sections of the memory are blocks, and wherein the particular section of the memory is a boot block.

* * * * *